United States Patent [19]

Hamamoto et al.

[11] Patent Number: 5,252,873
[45] Date of Patent: Oct. 12, 1993

[54] DC BRUSHLESS MOTOR

[75] Inventors: Syougo Hamamoto; Kouji Kuyama; Makoto Hasegawa, all of Yonago, Japan

[73] Assignee: Matsushita Electric Industrial Co., Ltd., Osaka, Japan

[21] Appl. No.: 925,746

[22] Filed: Aug. 7, 1992

[30] Foreign Application Priority Data

Sep. 6, 1991 [JP] Japan .................. 3-226974
Sep. 9, 1991 [JP] Japan .................. 3-227760

[51] Int. Cl.$^5$ .................. H02K 11/00; H02K 7/08
[52] U.S. Cl. .................. 310/90; 310/67 R; 310/68 R
[58] Field of Search .......... 310/40 MM, 67 R, 68 R, 310/90, 268, DIG. 6

[56] References Cited

U.S. PATENT DOCUMENTS

| | | | |
|---|---|---|---|
| 4,686,400 | 8/1987 | Fujisaki et al. | 310/67 R |
| 4,853,567 | 8/1989 | Muramatsu et al. | 310/67 R |
| 4,868,436 | 9/1989 | Attilio et al. | 310/67 R |
| 5,008,573 | 4/1991 | Beppu et al. | 310/67 R |

FOREIGN PATENT DOCUMENTS 127552 7/1983 Japan .................. 310/40 MM
0670017 4/1989 Switzerland .................. 310/40 MM Primary Examiner—Emanuel T. Voeltz
Assistant Examiner—C. LaBalle
Attorney, Agent, or Firm—Mason, Fenwick & Lawrence

[57] ABSTRACT

A DC brushless motor for use in various kinds of electric appliances comprises a rotor portion, and this rotor portion includes a rotating shaft and a cylindrical permanent magnet which is rotated with the shaft. A stator portion is provided opposite to the rotor portion, and includes an armature which is located at the inner side of the cylindrical permanent magnet so as to be opposite to and coaxial with the magnet. The armature is provided with a plurality of coils on its peripheries, and has an annular shape as a whole. A circuit board is disposed to be substantially perpendicular to the axis line of the rotating shaft, and the armature is supported above the circuit board. The rotating shaft terminates substantially at the middle of the height of the motor, thus leaving a space between the rotating shaft and the circuit board. An integrated circuit device for driving the motor or drive control of it is provided in the space which faces a central part of the armature, and displaced from the coils on the peripheries of the armature in the radially inward direction of the rotating shaft.

13 Claims, 4 Drawing Sheets

DC BRUSHLESS MOTOR

BACKGROUND OF THE INVENTION

The present invention relates to a direct-current (DC) brushless motor for use in an office automation instrument or an audio/visual apparatus and, more particularly, to a DC brushless motor of an improved structure.

A DC brushless motor to be improved by the invention has the following structure. A rotor portion of the motor includes a rotating shaft which is extended substantially through the center of the motor, and a rotary permanent magnet is attached to this rotating shaft so as to rotate with it. A stator portion of the motor includes an armature, and this armature is securely fixed above a circuit board so as to be opposite to the rotary magnet. Further, an integrated circuit device (hereinafter referred to as IC) for driving the motor or drive controlling is provided on the circuit board at a location below coils on peripheral portions of the armature.

Recently, office automation instruments and audio-/visual apparatus tend to be smaller and thinner. Accordingly, there has also been an increasing demand for reducing the size and thickness of DC brushless motors.

SUMMARY OF THE INVENTION

The present invention has been achieved to answer the above-mentioned demand, and it is therefore an object of the invention to provide a DC brushless motor which is reduced in size and thickness.

Another object of the invention is to provide a DC brushless motor which is not only small and thin but also easy to assemble.

In order to achieve these objects, a DC brushless motor according to the invention has a structure in which an IC is provided on a circuit board at a location where it faces a central portion of an armature. A rotating shaft terminates substantially at the middle of the height of the motor, and the motor includes a means for receiving thrust which is exerted on the rotating shaft.

With this structure, an extra space between an end portion of the rotating shaft and the circuit board is obtained so that the IC can be placed in this space. As a result, the IC is located substantially at the center of the circuit board so that the other component parts seldom interfere with the pattern wiring from the IC. In consequence, the wiring pattern on the circuit board can be made compact, to thereby enable the size reduction of the circuit board. Further, it is easy to perform the pattern wiring from the IC. Thus, the DC brushless motor can be reduced in size, and also, this motor is easy to assemble.

Moreover, although the IC requires the largest space of all the circuit component parts, the IC is provided at the location where it faces the central portion of the armature so that coils on peripheral portions of the armature and the IC are away from each other in the radial direction of the motor and not located one above the other. Consequently, it is not necessary to make the height of the motor as large as to contain the coils of the armature and the IC which are located vertically, thereby reducing the thickness of the DC brushless motor.

The above-described and other objects, characteristics and advantages of the invention will be more clearly understood from the detailed description with reference to the attached drawings.

DETAILED DESCRIPTION OF THE INVENTION

One example of the structure of a conventional brushless motor will first be described with reference to FIG. 7 so that the present invention can be understood more easily.

Figure 7:
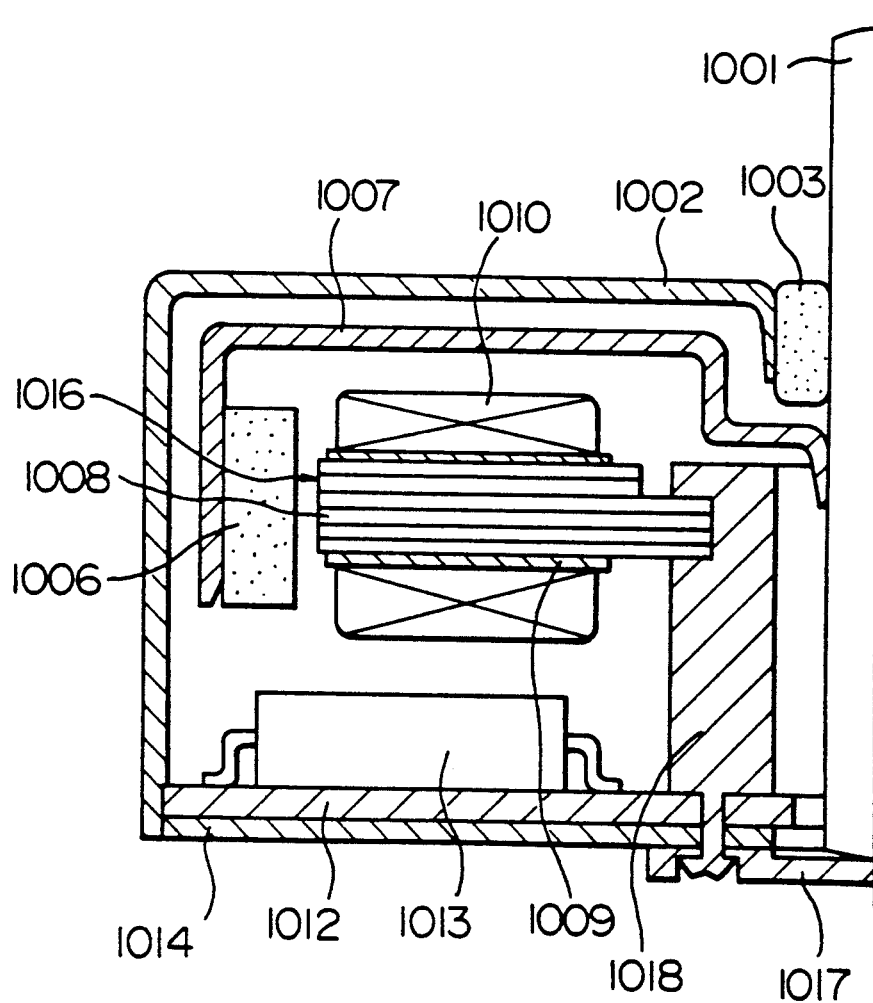
FIG. 7 is a cross-sectional view showing a half of a conventional DC brushless motor.

Referring to FIG. 7, the conventional DC brushless motor comprises a frame 1002 which has an inverted cup-like shape and serves also as a cover of the motor. A rotor portion and a stator portion of the motor are assembled on this frame. The rotor portion comprises a rotating shaft 1001 and a rotary permanent magnet 1006, and the stator portion comprises an armature 1016 and a circuit board 1012.

The rotating shaft 1001 of the rotor portion is extended through a center portion of the frame 1002. The rotating shaft 1001 is rotatably supported by a bearing 1003 which is press-fitted in the center portion of the frame 1002 and a thrust receiving plate 1017 securely fixed to the circuit board 1012.

A rotor frame 1007 is provided on the rotating shaft 1001 so as to rotate with it. As shown in FIG. 7, the rotor frame 1007 has a cross-sectional configuration extending outwardly along the inner surface of the frame 1002. A distal end portion of the rotor frame 1007 is bent to be in parallel to the rotating shaft 1001 and a side wall of the frame 1002. The rotary permanent magnet 1006 is fixed on the inside of this bent portion so as to be coaxial with the rotating shaft 1001. Thus, the rotor portion is constituted. The rotary permanent magnet 1006 has a cylindrical shape and is magnetized to have a plurality of poles.

The armature 1016 of the stator portion has an annular shape as a whole and is located at the inner side of the rotary permanent magnet 1006 so as to be opposite to and coaxial with the magnet. The armature 1016 includes an iron core 1008 formed by laminating a plurality of plates, and a plurality of coils 1010 which are wound on peripheral portions thereof through insulators 1009. This armature is supported above the circuit board 1012 by means of a cylindrical resin member 1018.

The circuit board 1012 is provided in an opening at the bottom of the frame 1002 so as to be substantially perpendicular to the axis line of the rotating shaft 1001. An IC 1013 is mounted on the circuit board 1012 at a location below the coils 1010 of the armature 1016 and electrically connected to a wiring pattern of the board 1012. A shield plate 1014 for insulating magnetic noises is provided under the circuit board 1012.

In order to assemble such a DC brushless motor, the rotor portion is attached to the frame 1002, and then, the stator portion is incorporated with them. More specifically, the IC 1013 is mounted on the circuit board 1012, and after that, the shield plate 1014 is provided under the board 1012. Next, the armature 1016 is securely fixed above the circuit board 1012 by means of the resin member 1018 so as to be opposite to the rotary permanent magnet 1006. Thus, the assembled stator portion is attached to the frame 1002, thereby completing the assembly of the DC brushless motor.

In the above-described arrangement, the IC 1013 is mounted on the circuit board 1012 at a location opposite to the coils 1010 on the peripheral portions of the armature 1016. Therefore, as described before, other component parts interfere with the pattern wiring from the IC. As a result, the pattern wiring from the IC is restricted and difficult, and also, the size of the circuit board 1012 must be made large to ensure the installation of required wiring patterns, so that the size reduction of the motor can not be performed without difficulty.

Even with the above-described structure, it is possible to reduce the thickness of the motor to some extent by mounting the IC 1013 on the circuit board 1012 in such a manner that it will occupy a position below a slot portion between one salient pole and an adjacent salient pole of the armature 1016. In this case, however, the IC 1013 must be prevented from contacting with the coils 1010 of the armature 1016, and it is difficult to reduce the thickness of the DC brushless motor.

Next, a DC brushless motor according to one embodiment of the present invention will be described with reference to FIGS. 1 to 6. For brevity's sake, substantially the same component parts will be denoted by common reference numerals, and their explanations will be omitted from the following description.

Figure 1:
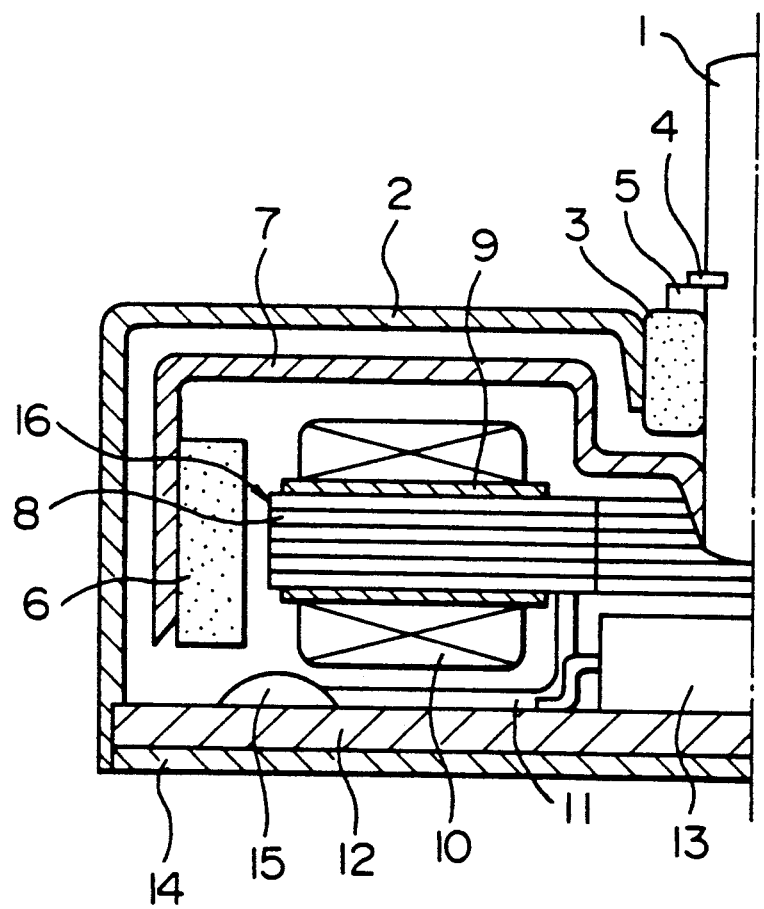
FIG. 1 is a cross-sectional view showing a half of a DC brushless motor according to a first embodiment of the present invention.

Referring to FIG. 1, the DC brushless motor according to the embodiment of the invention comprises a frame 2 which has substantially the same shape as that of the conventional example, and a rotor portion and a stator portion of the motor are assembled on this frame. A circuit board 12 is provided in a opening at the bottom of the frame 2. Also, a shield plate 14 for insulating magnetic noises is provided under the board 12.

A rotating shaft 1 of the rotor portion is extended through a center portion of the frame 2 and rotatably supported by a bearing 3 provided in the center portion of the frame 2. However, the rotating shaft 1 is different from that of the conventional example in that it is shorter so that it terminates substantially at the middle of the height of the frame 2. Therefore, a locating snap ring 4 is attached to the rotating shaft 1. This snap ring is in contact with the bearing 3 through a spacer 5 in order to suppress movement of the rotating shaft 1 in a direction of the thrust instead of the thrust receiving plate in the conventional example.

A rotor frame 7 which is substantially the same as that of the conventional example is provided on the rotating shaft 1. Further, a rotary permanent magnet 6 which has a cylindrical shape and is magnetized to have a plurality of poles is securely fixed on the inside of a bent distal-end portion of the rotor frame 7. Thus, the rotor portion is constituted.

In a similar manner to the conventional example, an armature 16 of the stator portion has an annular shape as a whole and is provided inside of the frame 2 so as to be opposite to and coaxial with the rotary permanent magnet 6. Also, the armature 16 includes an iron core 8 and coils 10 which are wound thereon through insulators 9. However, this armature is different from that of the conventional example in that it is supported above the circuit board 12 by means of a fixing member 11 having a substantially L-shaped cross-sectional configuration. Further, an opening is formed in a central portion of the iron core 8 so that the end portion of the rotating shaft 1 will be passed through the opening.

In this embodiment, as described above, the rotating shaft 1 terminates without reaching the circuit board 12 so that an empty space remains above that portion of the board 12 which is opposite to the rotating shaft 1 or in a central portion of the armature 8. An IC 13 is mounted on this portion of the circuit board 12 and electrically connected to a wiring pattern of the board 12.

Although the DC brushless motor in this embodiment is assembled in substantially the same manner as the conventional example, the fixing member 11 is secured on the circuit board 12 by use of a fixing material 15.

Figure 2:
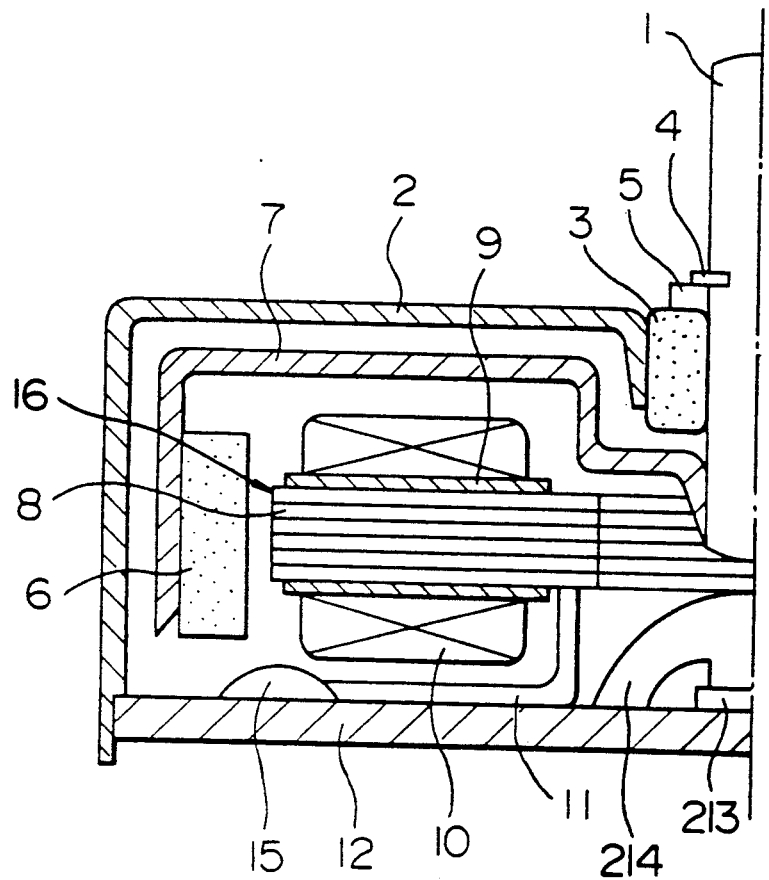
FIG. 2 is a cross-sectional view showing a half of a DC brushless motor according to a second embodiment of the invention.

FIG. 2 shows a DC brushless motor according to another embodiment of the invention. In the figure, substantially the same component parts as those of the above-described embodiment are denoted by common reference numerals.

The DC brushless motor in this embodiment has substantially the sam structure as the first embodiment except for a circuit board. More specifically, a frame 2 has an inverted cup-like shape, and a short rotating shaft 1 is extended through a center portion of the frame 2. The rotating shaft 1 is rotatably supported by a bearing 3 provided in the center portion of the frame 2, and a locating snap ring 4 is attached to the rotating shaft 1. This snap ring is in contact with the bearing 3 through a spacer 5 in order to suppress movement of the rotating shaft 1 in a direction of the thrust.

In a similar manner to the first embodiment, a rotor portion of the motor comprises the rotating shaft 1, a rotor frame 7 securely fixed on the rotating shaft 1, and a cylindrical permanent magnet 6 secured on the distal end of the rotor frame 7.

Also, an armature 16 of a stator portion of the motor likewise includes coils 10 which are wound thereon through insulators 9 and is provided inside of the frame 2 so as to be opposite to the rotary permanent magnet 6. This armature is supported above the circuit board by means of a fixing member 11 and a fixing material 15.

On the other hand, the circuit board 212 is different from that of the first embodiment in that it is made of a metal. The metallic circuit board 212 is provided in an opening at the bottom of the frame 2 so as to be substantially perpendicular to the axis line of the rotating shaft 1. No shield plate is provided because the circuit board itself functions to insulate magnetic noises.

In this embodiment as well, an empty space remains above that portion of the circuit board 212 which is opposite to the rotating shaft 1 or the central portion of the armature 16. An IC chip 213 is mounted on this portion of the circuit board 212 and electrically connected to a wiring pattern of the board 212. The IC chip 213 is sealed by use of a thermosetting resin 214.

Next, various supporting structures of the rotating shaft in the rotor portion will be described with reference to FIGS. 3 to 6. Component parts of the following embodiments which are different from those of the above-described embodiments will be only explained.

Figure 3:
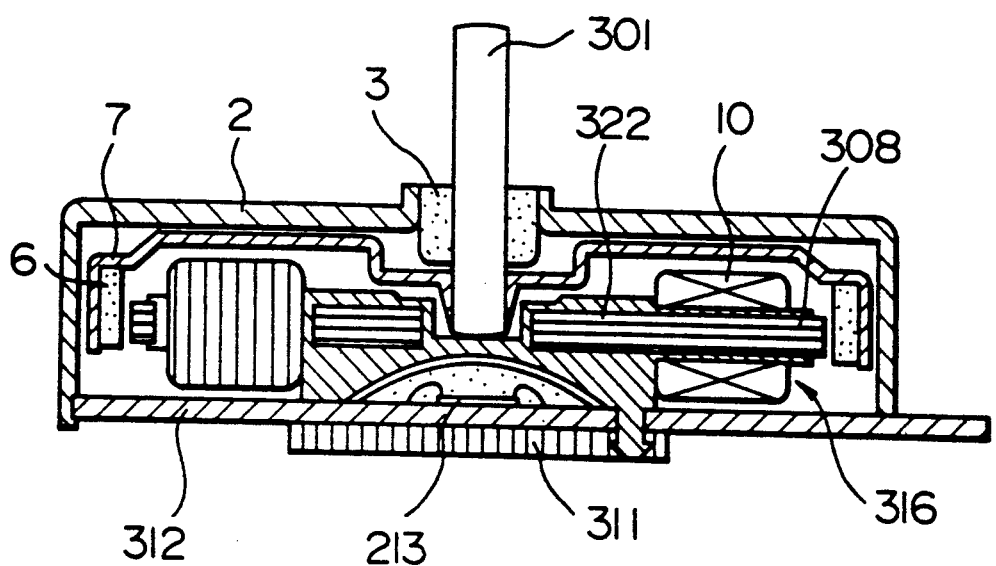
FIG. 3 is a cross-sectional view showing a brushless motor according to a third embodiment of the invention.

Referring to FIG. 3, in a brushless motor according to a third embodiment of the invention, a rotating shaft 301 is rotatably supported by a bearing 3 which is press-fitted in a frame 2. A rotor frame 7 and a cylindrical permanent magnet 6 are provided on the rotating shaft 301 so as to rotate with it. A fixed armature 316 includes an iron core 308 formed by laminating a plurality of plates, and a through hole is bored in a central portion of the iron core. The iron core 308 is covered with an electrically insulating member 322 through which coils 10 are wound on the iron core. An IC 213 is disposed opposite to the through hole of the iron core 308.

As shown in FIG. 3, the electrically insulating member 322 is shaped not only to serve as an insulating material for the iron core 308 but also to support the armature 316. The member 322 is formed with a leg section while a through hole is bored in a metallic wiring printed board 312 so that the member 322 is secured on the board 312 by inserting the leg section into the hole in the board 312 and engaging it with a fixing member 311. Also, the member 322 plugs the through hole of the iron core 308 where one end of the rotating shaft 301 is supported and thrust exerted on the shaft is received.

In this embodiment, as described above, the insulating member plugs the central through hole in the iron core of the armature and serves to receive thrust on the rotating shaft. As a result, the IC for driving the motor can be provided below the center of the fixed armature, thereby largely reducing the size and thickness of the brushless motor.

Figure 4:
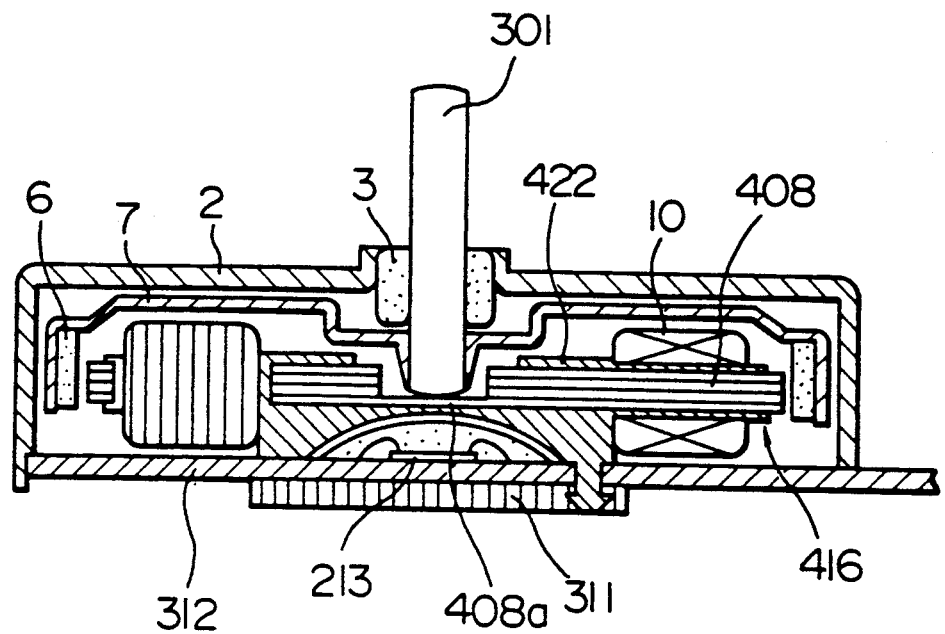
FIG. 4 is a cross-sectional view showing a brushless motor according to a fourth embodiment of the invention.

FIG. 4 illustrates a brushless motor according to a fourth embodiment of the invention. The motor of this embodiment has substantially the same structure as the embodiment shown in FIG. 3 except for an armature 416. The armature 416 includes an iron core 408 which consists of a plurality of plates, and a hole is formed substantially through the iron core 408 in a manner similar to the above-described embodiment, but one of the plates 408a is left unworked. The plate 408a supports one end of the rotating shaft 301 and receives thrust exerted on the shaft. Further, an insulating member 422 is shaped to support the back surface of the plate 408a in accordance with a change in the shape of the iron core 408. In this embodiment, the rigidity of the thrust receiving means is increased to thereby receive a larger load.

Figure 5:
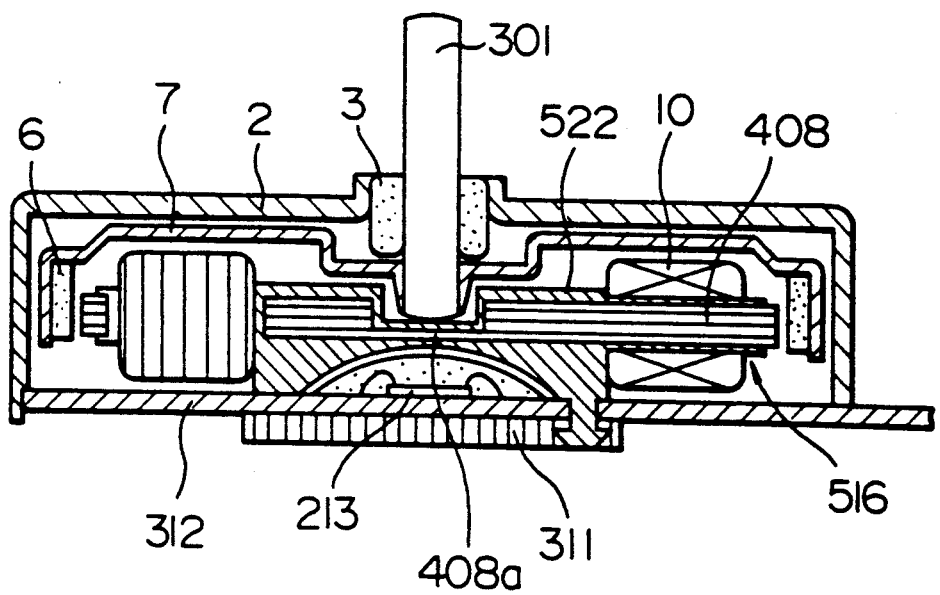
FIG. 5 is a cross-sectional view showing a brushless motor according to a fifth embodiment of the invention.

FIG. 5 illustrates a brushless motor according to a fifth embodiment of the invention. The motor of this embodiment has substantially the same structure as the embodiment shown in FIG. 4 except for an insulating member 522 of an armature 516. In this embodiment, the top surface of a plate 408a of an iron core 408 is covered with the insulating member 522 through which one end of a rotating shaft 301 is supported. Since the brushless motor is constructed in this manner, the rotating shaft and the iron core can be prevented from contacting with each other directly, thus lengthening the durability of the motor reduced in size and thickness.

Figure 6:
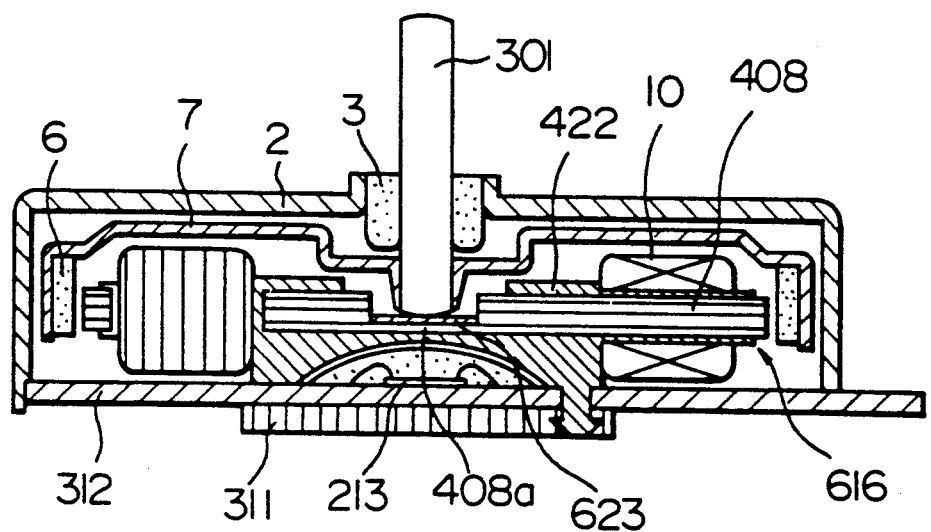
FIG. 6 is a cross-sectional view showing a brushless motor according to a sixth embodiment of the invention.

FIG. 6 illustrates a brushless motor according to a sixth embodiment of the invention. The motor of this embodiment has substantially the same structure as the embodiment shown in FIG. 4 except for an armature 616. In this embodiment, a wear resisting member 623 is secured on the top surface of a plate 408a of an iron core 408 so that one end of a rotating shaft 301 is supported through this member. Since the brushless motor is constructed in this manner, the rotating shaft and the iron core can be prevented from contacting with each other directly, thus lengthening the durability of the motor reduced in size and thickness.

As clearly understood from the above description, in the DC brushless motor according to the invention, there is a space on that portion of the circuit board which is opposite to the central portion of the armature, and the IC for driving the motor or drive controlling is provided in this space. In consequence, the IC and the coils on the peripheral portions of the armature are not located one above the other, and a space for containing both these members which are vertically located is not necessary. Therefore, the height of the DC brushless motor of the invention can be made smaller than that of the conventional motor. Moreover, since the IC is located substantially at the center of the circuit board, the other component parts seldom interfere with the pattern wiring from the IC, and the wiring operation can be easily performed. Also, the wiring pattern can be made relatively compact. As a result, the circuit board of the DC brushless motor of the invention can be made smaller than that of the conventional motor, thereby reducing the outer dimensions of the whole motor.

Although the present invention has been described heretofore on the basis of the preferred embodiments, the invention will not be restricted to these particular forms but can be modified in various manners or realized in different forms without deviating from the scope of the attached claims of the invention.

What is claimed is:

1. A DC brushless motor comprising:
   a rotor portion including a rotating shaft and a multipolar permanent magnet which is carried by said rotating shaft so as to be rotated with it;
   a means for rotatably supporting said rotating shaft; and
   a stator portion including an armature which is provided with coils on its peripheries, a circuit board above which said armature is fixed to be opposite to said rotary permanent magnet, and an integrated circuit device for drive control of the motor, said integrated circuit device being provided on said circuit board at a location where it faces a central part of said armature, said rotating shaft terminating substantially at the middle of the height of said motor so as to leave a space between the end of said rotating shaft and said circuit board, and said motor further including a means for receiving thrust exerted on said rotating shaft, and said armature including an iron core formed by laminating a plurality of plates, and a bottom portion of a hole bored in said iron core constituting said thrust receiving means.

2. A DC brushless motor according to claim 1, wherein said permanent magnet has a cylindrical shape and is located to be coaxial with and apart from said rotating shaft, and said armature has an annular shape as a whole and is located between said cylindrical permanent magnet and said rotating shaft.

3. A DC brushless motor according to claim 2, wherein said rotor portion further includes a rotor frame which is securely fixed on said rotating shaft and extended radially outwardly, and said cylindrical permanent magnet is magnetized to have a plurality of poles, said magnet being carried by said rotating shaft through said rotor frame, said armature being located at the inner side of said cylindrical permanent magnet so as to be opposite to the inner side wall of said cylindrical permanent magnet.

4. A DC brushless motor according to claim 1, wherein said support means includes a frame and a bearing for rotatably supporting said rotating shaft, and said frame has an inverted cup-like shape having an opening at the bottom, said bearing being extended substantially through the center of said frame so as to support said rotating shaft along the axis line of said frame of the inverted cup-like shape, said circuit board being provided in the opening at the bottom of said frame so as to be substantially perpendicular to the axis line of said rotating shaft.

5. A DC brushless motor according to claim 1, wherein said thrust receiving means comprises a snap ring secured on said rotating shaft and a spacer disposed between said snap ring and said support means so that when thrust is exerted on said rotating shaft, said snap ring is brought into contact with said support means through said spacer to thereby receive the thrust.

6. A DC brushless motor according to claim 1, wherein said armature further includes an electrically insulating member which covers said iron core, and said electrically insulating member which plugs said hole constitutes the bottom portion of said hole.

7. A DC brushless motor according to claim 1, wherein the bottom portion of said hole is formed of at least one of said plates.

8. A DC brushless motor according to claim 1, wherein a wear resisting member is provided on the bottom portion of said hole.

9. A DC brushless motor comprising:
a rotor portion including a rotating shaft and a multi-polar permanent magnet which is carried by said rotating shaft so as to be rotated with it;
means for rotatably supporting said rotating shaft; and
a stator portion including an armature which is provided with coils on its peripheries, a circuit board above which said armature is fixed to be opposite to said rotary permanent magnet, and an integrated circuit device for drive control of the motor, said integrated circuit device being provided on said circuit board at a location where it faces a central part of said armature, said rotating shaft terminating substantially at the middle of the height of said motor so as to leave a space between the end of said rotating shaft and said circuit board, and said motor further including a means for receiving thrust exerted on said rotating shaft.

10. A DC brushless motor according to claim 9, wherein said permanent magnet has a cylindrical shape and is located to be coaxial with and apart from said rotating shaft, and said armature has an annular shape as a whole and is located between said cylindrical permanent magnet and said rotating shaft.

11. A DC brushless motor according to claim 10, wherein said rotor portion further includes a rotor frame which is securely fixed on said rotating shaft and extended radially outwardly, and said cylindrical permanent magnet is magnetized to have a plurality of poles, said magnet being carried by said rotating shaft through said rotor frame, said armature being located at the inner side of said cylindrical permanent magnet so as to be opposite to the inner side wall of said cylindrical permanent magnet.

12. A DC brushless motor according to claim 9, wherein said support means includes a frame and a bearing for rotatably supporting said rotating shaft, and said frame has an inverted cup-like shape having an opening at the bottom, said bearing being extended substantially through the center of said frame so as to support said rotating shaft along the axis line of said frame of the inverted cup-like shape, said circuit board being provided in the opening at the bottom of said frame so as to be substantially perpendicular to the axis line of said rotating shaft.

13. A DC brushless motor according to claim 9, wherein said thrust receiving means comprises a snap ring secured on said rotating shaft and a spacer disposed between said snap ring and said support means so that when thrust is exerted on said rotating shaft, said snap ring is brought into contact with said support means through said spacer to thereby receive the thrust.

* * * * *